(12) United States Patent
Kuro

(10) Patent No.: US 11,978,717 B2
(45) Date of Patent: May 7, 2024

(54) SEMICONDUCTOR MANUFACTURING APPARATUS

(71) Applicant: Kioxia Corporation, Tokyo (JP)

(72) Inventor: Yuuki Kuro, Mie Mie (JP)

(73) Assignee: KIOXIA CORPORATION, Tokyo (JP)

( * ) Notice: Subject to any disclaimer, the term of this patent is extended or adjusted under 35 U.S.C. 154(b) by 305 days.

(21) Appl. No.: 17/462,839

(22) Filed: Aug. 31, 2021

(65) Prior Publication Data

US 2022/0293551 A1 Sep. 15, 2022

(30) Foreign Application Priority Data

Mar. 12, 2021 (JP) ................. 2021-040446

(51) Int. Cl.
*B32B 41/00* (2006.01)
*H01L 23/00* (2006.01)

(52) U.S. Cl.
CPC .............. *H01L 24/75* (2013.01); *H01L 24/73* (2013.01); *H01L 2224/73104* (2013.01);
(Continued)

(58) Field of Classification Search
CPC ............ H01L 24/75; H01L 24/73; H01L 2224/73104; H01L 2224/7555; H01L 2224/75735; H01L 2224/75745; H01L 2224/75984; H01L 2224/75987; H01L 21/563; H01L 24/13; H01L 24/16; H01L 24/81; H01L 2224/0401; H01L 2224/13111; H01L 2224/16227; H01L 2224/16238; H01L 2224/26175; H01L 2224/81005; H01L 2224/81815; H01L 2924/1815; H01L 21/54; H01L 21/67092; H01L 2224/753; H01L 2224/75703
(Continued)

(56) References Cited

U.S. PATENT DOCUMENTS 7,886,796 B2 2/2011 Ok
8,895,359 B2 11/2014 Tomura et al.
(Continued)

FOREIGN PATENT DOCUMENTS

JP 2001-102414 A 4/2001
JP 2004-349399 12/2004
(Continued)

*Primary Examiner* — Michael N Orlando
*Assistant Examiner* — Joshel Rivera
(74) *Attorney, Agent, or Firm* — Foley & Lardner LLP

(57) ABSTRACT

A semiconductor manufacturing apparatus includes a stage capable of holding thereon an interconnection substrate. A tool presses the interconnection substrate and a semiconductor chip against each other between the tool and the stage. The tool includes a main body portion that has a holding surface holding thereon the semiconductor chip. A first protruding portion is provided along an outer edge of the holding surface and protrudes from the holding surface toward the stage. A second protruding portion is provided outside of the first protruding portion along the outer edge of the holding surface and protrudes from the holding surface toward the stage. A groove portion is provided between the first protruding portion and the second protruding portion.

17 Claims, 7 Drawing Sheets

(52) U.S. Cl.
CPC ............... *H01L 2224/7555* (2013.01); *H01L 2224/75735* (2013.01); *H01L 2224/75745* (2013.01); *H01L 2224/75984* (2013.01); *H01L 2224/75987* (2013.01)

(58) Field of Classification Search
USPC ................... 156/60, 64, 350, 351, 378, 379
See application file for complete search history.

(56) References Cited

U.S. PATENT DOCUMENTS

| | | |
|---|---|---|
| 10,510,672 B2 | 12/2019 | Kim et al. |
| 2011/0020983 A1 | 1/2011 | Tomura et al. |
| 2011/0175237 A1 | 7/2011 | Tomura et al. |
| 2016/0190087 A1* | 6/2016 | Yu ........................... H01L 24/75 156/538 |

FOREIGN PATENT DOCUMENTS

| | | | | |
|---|---|---|---|---|
| JP | 2008-034571 A | | 2/2008 | |
| JP | 2010147033 A | * | 7/2010 | ........... H01L 21/563 |
| JP | 2019-110227 | | 7/2019 | |
| WO | WO-2009/128206 A1 | | 10/2009 | |
| WO | WO-2010/070806 A1 | | 6/2010 | |

* cited by examiner

SEMICONDUCTOR MANUFACTURING APPARATUS

CROSS-REFERENCE TO RELATED APPLICATION(S)

This application is based upon and claims the benefit of priority from Japanese Patent Application No. 2021-040446, filed Mar. 12, 2021, the entire contents of which are incorporated herein by reference.

FIELD

Embodiments described herein relate generally to a semiconductor manufacturing apparatus.

BACKGROUND

A bonding apparatus is used for flip-chip bonding a plurality of semiconductor chips. The bonding apparatus mounts each semiconductor chip on an interconnection substrate, surrounds the semiconductor chip with an attachment tool, i.e., bonding tool, and pressurizes the semiconductor chip against the interconnection substrate while heating the semiconductor chip. Electrode bumps of the semiconductor chip are thereby connected to pads, i.e., lead electrodes of the interconnection substrate. Furthermore, at this time, a space between the semiconductor chip and the interconnection substrate is filled with a resin, i.e., an underfill material such as an NCF (Non-Conductive Film), and the semiconductor chip is encapsulated with the resin on the interconnection substrate.

However, a height of the bonding tool relative to the interconnection substrate depends on a volume of the resin, so that there is a risk of unevenness in heights of semiconductor chips relative to the interconnection substrate. The unevenness in height positions of the semiconductor chips results in unevenness in thicknesses of semiconductor packages.

Moreover, at a time of encapsulating the semiconductor chip with the resin, air bubbles generated in the resin lose means of escape and often remain in the resin. The air bubbles trigger a vapor explosion in a subsequent reflow process, causes a leak path, and yet causes an impairment in reliability.

DETAILED DESCRIPTION

Embodiments provide a semiconductor manufacturing apparatus capable of preventing unevenness in heights of semiconductor chips relative to an interconnection substrate, preventing generation of air bubbles within an underfill material, and manufacturing a highly reliable semiconductor device.

In general, according to at least one embodiment, a semiconductor manufacturing apparatus includes a stage capable of holding thereon an interconnection substrate. A bonding tool presses the interconnection substrate and a semiconductor chip against each other between the bonding tool and the stage. The bonding tool includes a main body portion that has a holding surface holding thereon the semiconductor chip. A first protruding portion is provided along an outer edge of the holding surface and protrudes from the holding surface toward the stage. A second protruding portion is provided outside of the first protruding portion along the outer edge of the holding surface and protrudes from the holding surface toward the stage. A groove portion is provided between the first protruding portion and the second protruding portion.

Embodiments according to the disclosure will be described hereinafter with reference to the drawings. It is to be noted that the present embodiments are not intended to limit the disclosure. The drawings are either schematic or conceptual and proportions and the like of elements are not necessarily identical to actual proportions and the like. In the specification and the drawings, similar elements to those described previously with respect to the drawings already referred to are denoted by the same reference signs and detailed descriptions thereof are omitted as appropriate.

First Embodiment

Figure 1:
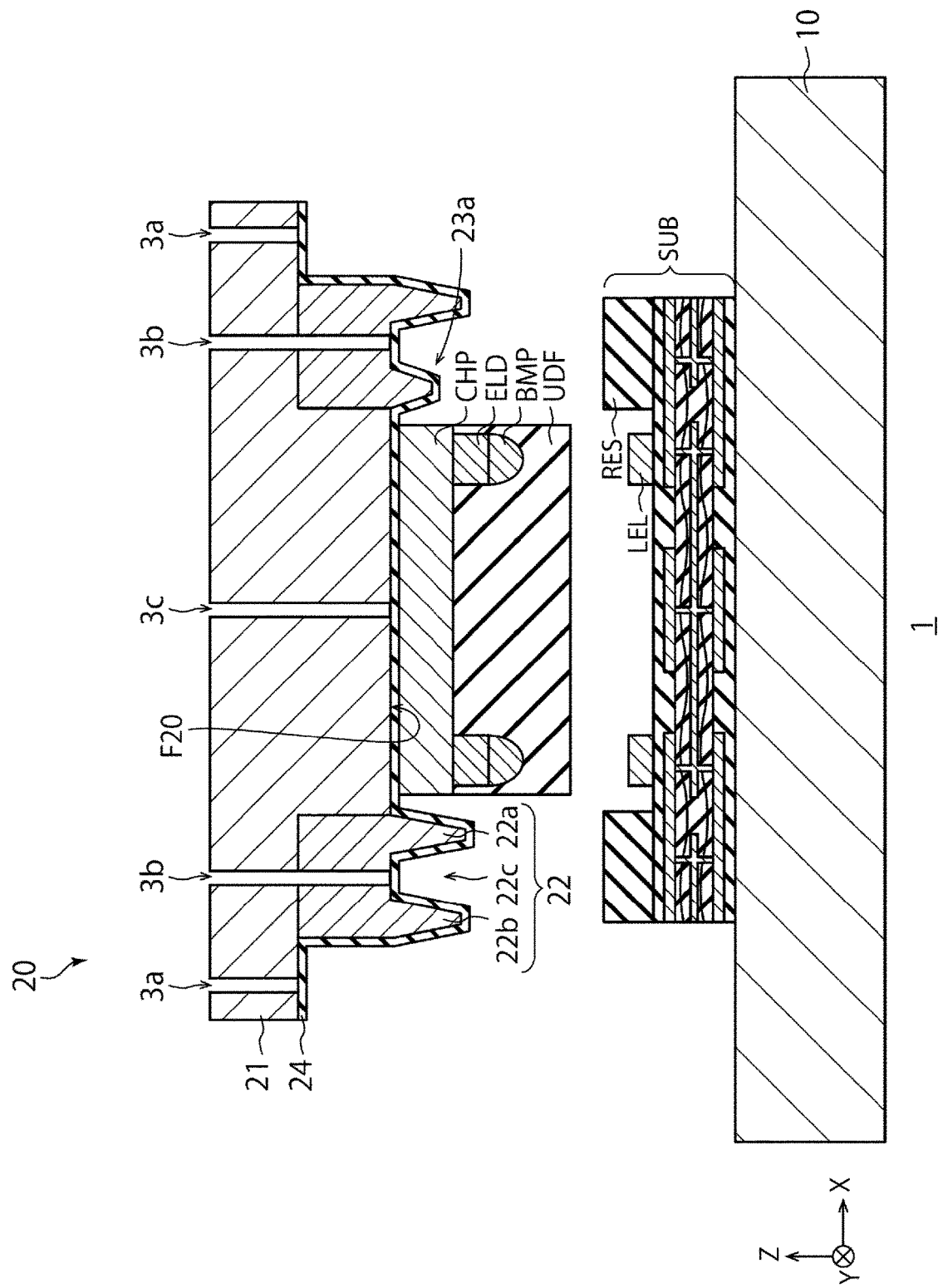
FIG. 1 is a schematic cross-sectional view showing an example of configurations of a bonding apparatus according to a first embodiment.

FIG. 1 is a schematic cross-sectional view showing an example of configurations of a bonding apparatus 1 according to a first embodiment. The bonding apparatus 1 that serves as a semiconductor manufacturing apparatus is configured with a stage 10 and a bonding tool 20. The bonding apparatus 1 mounts a semiconductor chip CHP on an interconnection substrate SUB placed on the stage 10, and electrically connects electrodes ELD of the semiconductor chip CHP to lead electrodes LEL of the interconnection substrate SUB via bumps BMP by pressurizing and heating the semiconductor chip CHP. It is noted that a pressing direction of the bonding tool 20 (generally perpendicular direction to a mount surface of the stage 10) is assumed as a Z direction. It is also assumed that one direction of a perpendicular plane to the Z direction is an X direction and that a direction orthogonal to the X direction is a Y direction.

The stage 10 is configured to be capable of holding the interconnection substrate SUB on a front surface thereof. The stage 10 fixes the interconnection substrate SUB by either a vacuum chuck or an electromagnetic chuck. For example, a metal such as stainless steel is used for the stage 10. The interconnection substrate SUB is a multilayer interconnection substrate in which a plurality of interconnection layers and a plurality of insulating layers are stacked. For example, a conductive metal such as copper is used for the interconnection layers. For example, an insulating material such as a glass epoxy resin is used for the insulating layers. A solder resist RES and the lead electrodes LEL are provided on a front surface of the interconnection substrate SUB. The solder resist RES is provided around a region on the interconnection substrate SUB to which the semiconductor chip CHP is to be connected, and the solder resist RES comes in contact with at least a portion of a protruding portion 22 at a time of bonding.

The bonding tool 20 is configured with a main body portion 21 having a holding surface F20 that holds thereon the semiconductor chip CHP, and the protruding portion 22 protruding from the holding surface F20 toward the stage 10 in the Z direction. The bonding tool 20 presses the semiconductor chip CHP held on the holding surface F20 against the interconnection substrate SUB on the stage 10 in the Z direction. The bonding tool 20 has a heater, not shown, and is capable of heating the metal bumps BMP and an underfill material UDF. It is noted that in a bonding process of bonding the semiconductor chip CHP, the bonding tool 20 may move toward the stage 10 or the stage 10 may move toward the bonding tool 20.

A through-hole 3c is provided in the holding surface F20 of the bonding tool 20. The through-hole 3c passes through an interior of the bonding tool 20 from the holding surface F20 and is joined with a vacuum device, not shown, provided outside of the bonding tool 20. The through-hole 3c also penetrates a film 24 that lies between the semiconductor chip CHP and the holding surface F20 and is capable of suctioning a front surface of the semiconductor chip CHP by vacuuming. That is, the film 24 covers the holding surface F20 and has an opening at a position corresponding to the through-hole 3c that communicates with the outside of the bonding tool 20. The semiconductor chip CHP can be thereby kept suctioned onto and held on the holding surface F20 of the bonding tool 20 even when the holding surface F20 is pointed vertically downward. For example, an insulating material such as a resin is used for the film 24. The film 24 is capable of preventing direct adhesion of the underfill material UDF onto the bonding tool 20.

In this way, the bonding tool 20 is capable of pointing the holding surface F20 to the stage 10, heating the semiconductor chip CHP, and pressurizing the semiconductor chip CHP against the interconnection substrate SUB on the stage 10 while holding the semiconductor chip CHP. The bonding tool 20 is vertically and laterally movable relatively to the stage 10 while holding the semiconductor chip CHP. At this time, the metal bumps BMP are heated and melted, and connect the electrodes ELD to the lead electrodes LEL. For example, a solder material containing tin (Sn) as a main component is used for the metal bumps BMP. Furthermore, the underfill material UDF adhesively attached or coated onto the semiconductor chip CHP is deformed and filled into a space between the semiconductor chip CHP and the interconnection substrate SUB. Surroundings of the electrodes ELD, the lead electrodes LEL, and the metal bumps BMP are encapsulated with the underfill material UDF, and the underfill material UDF protects connection portions of the electrodes ELD, the lead electrodes LEL, and the metal bumps BMP. An insulating material, e.g., a liquid resin such as an NCP (Non-Conductive Paste) or a film-like resin such as an NCF (Non-Conductive Film) is used for the underfill material UDF.

Moreover, the bonding tool 20 is configured with the protruding portion 22 provided around the holding surface F20 and protruding from the holding surface F20 toward the stage 10. The protruding portion 22 includes a first protruding portion 22a, a second protruding portion 22b, and a groove 22c. The first protruding portion 22a is provided along an outer edge of the holding surface F20 in an XY plane and protrudes from the holding surface F20 toward the stage 10 in the Z direction. The second protruding portion 22b is provided outside of the first protruding portion 22a along the outer edge of the holding surface F20 in the XY plane and protrudes from the holding surface F20 toward the stage 10 in the Z direction. The groove 22c is provided between the first protruding portion 22a and the second protruding portion 22b, and is capable of accommodating therein the underfill material UDF overflowing from a holding surface F20-side to an outside of the first protruding portion 22a when the protruding portion 22 is pressed against the interconnection substrate SUB. The groove 22c is provided along the outer edge of the holding surface F20 in the XY plane and depressed in the Z direction to correspond to protrusion of the first and second projection portions 22a and 22b. The groove 22c is configured to have a depth and a width enough to accommodate therein an amount of the underfill material UDF overflowing to the outside of the first protruding portion 22a. The depth of the groove 22c may be, for example, a length from a tip end of each of the first and second protruding portions 22a and 22b to a height level of the holding surface F20. The width of the groove 22c, i.e., a distance between the tip end of the first protruding portion 22a and the tip end of the second protruding portion 22b, may be approximately 100 μm to 300 μm. A material lower in elastic modulus than a material for the main body portion 21 of the bonding tool 20 is used for the first and second protruding portions 22a and 22b. For example, a metallic material such as stainless steel may be used for the main body portion 21 while a resin material such as rubber may be used for the first and second protruding portions 22a and 22b. It is thereby possible to prevent damage of the interconnection substrate SUB even when the first and second protruding portions 22a and 22b come in contact with the interconnection substrate SUB.

The bonding tool 20 presses the semiconductor chip CHP against the interconnection substrate SUB until the bumps BMP of the semiconductor chip CHP come in contact with the lead electrodes LEL and at least a portion of the protruding portion 22 comes in contact with the interconnection substrate SUB. When the protruding portion 22 comes in contact with the interconnection substrate SUB, the main body portion 21, the protruding portion 22, and the interconnection substrate SUB form a space that accommodates therein the semiconductor chip CHP. The underfill material UDF is adhesively attached or coated onto the semiconductor chip CHP in advance, so that the underfill material UDF is filled into the space formed by the bonding tool 20 and the interconnection substrate SUB. In addition, the underfill material UDF overflows to the outside of the first protruding portion 22a from the space and is accommodated in the groove 22c.

Through-holes 3a, 3b, and 3c are provided in the bonding tool 20. The through-hole 3a is provided outside of the holding surface F20 and the protruding portion 22 and suctions the film 24. The through-hole 3b communicates with the groove 22c provided between the first protruding portion 22a and the second protruding portion 22b and suctions the film 24. The through-hole 3c communicates with the holding surface F20 as described above, and suctions the semiconductor chip CHP via the opening provided in the film 24.

Figure 2:
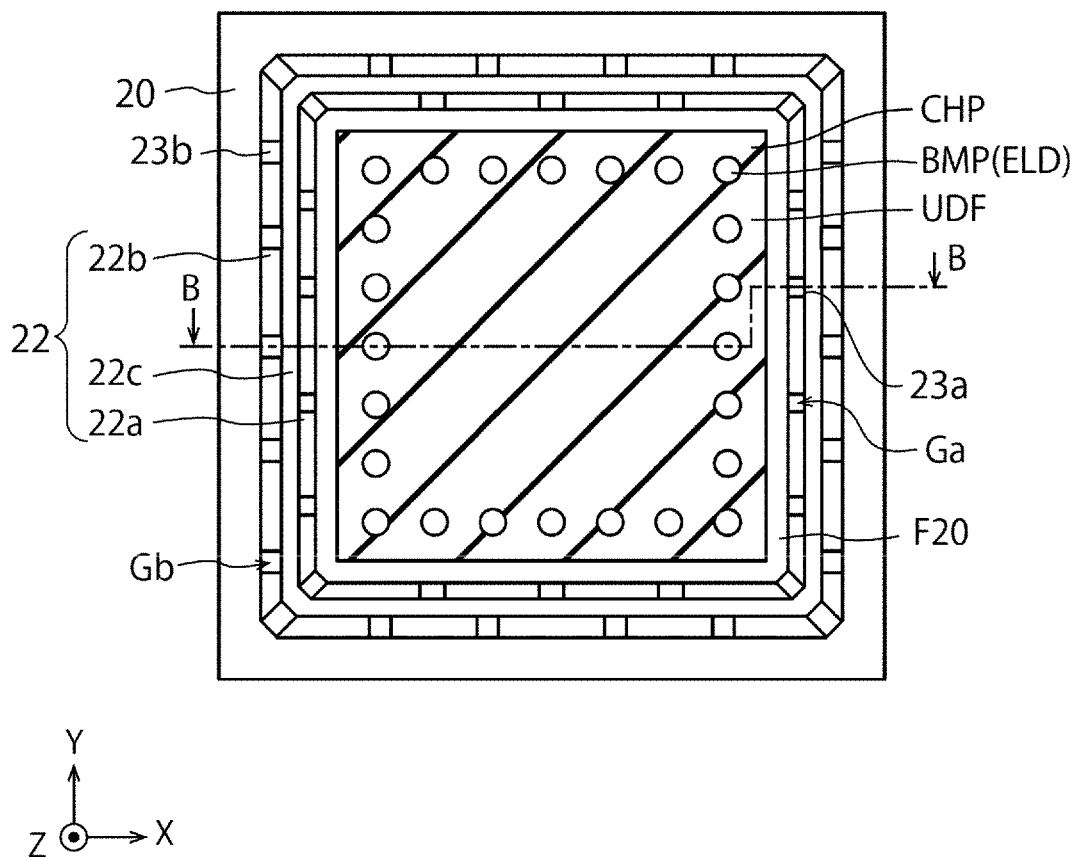
FIG. 2 is a plan view showing an example of configurations of a bonding tool.

FIG. 2 is a plan view showing an example of configurations of the bonding tool 20. FIG. 2 also shows the semiconductor chip CHP held on the holding surface F20 of the bonding tool 20. FIG. 1 shows a cross-section taken along a line B-B of FIG. 2.

As shown in FIG. 2, the protruding portion 22 is provided along the outer edge of the holding surface F20, i.e., an outer edge of the semiconductor chip CHP. The first protruding portion 22a is provided along the outer edge of the holding surface F20 and notch portions 23a serving as first notch portions are provided in portions of the first protruding portion 22a. The notch portions 23a are provided in the first protruding portion 22a along the outer edge of the holding surface F20 generally equidistantly. The notch portions 23a are formed lower than the first protruding portion 22a in other regions with reference to the holding surface F20. Owing to this, when the first protruding portion 22a comes in contact with the interconnection substrate SUB, a gap Ga is formed between each of the notch portions 23a and the interconnection substrate SUB. This gap Ga brings the space that is formed by the bonding tool 20 and the interconnection substrate SUB and that accommodates therein the semiconductor chip CHP into communication with an outside of the space in the XY plane.

The second protruding portion 22b is provided along the outer edge of the holding surface F20 and notch portions 23b serving as second notch portions are provided in portions of the second protruding portion 22b. The notch portions 23b are provided in the second protruding portion 22b along the outer edge of the holding surface F20 generally equidistantly. The notch portions 23b are formed lower than the second protruding portion 22b in other regions with reference to the holding surface F20. Owing to this, when the second protruding portion 22b comes in contact with the interconnection substrate SUB, a gap Gb is formed between each of the notch portions 23b and the interconnection substrate SUB. This gap Gb brings the groove 22c provided between the first protruding portion 22a and the second protruding portion 22b into communication with an outside of the groove 22c.

Figure 3:
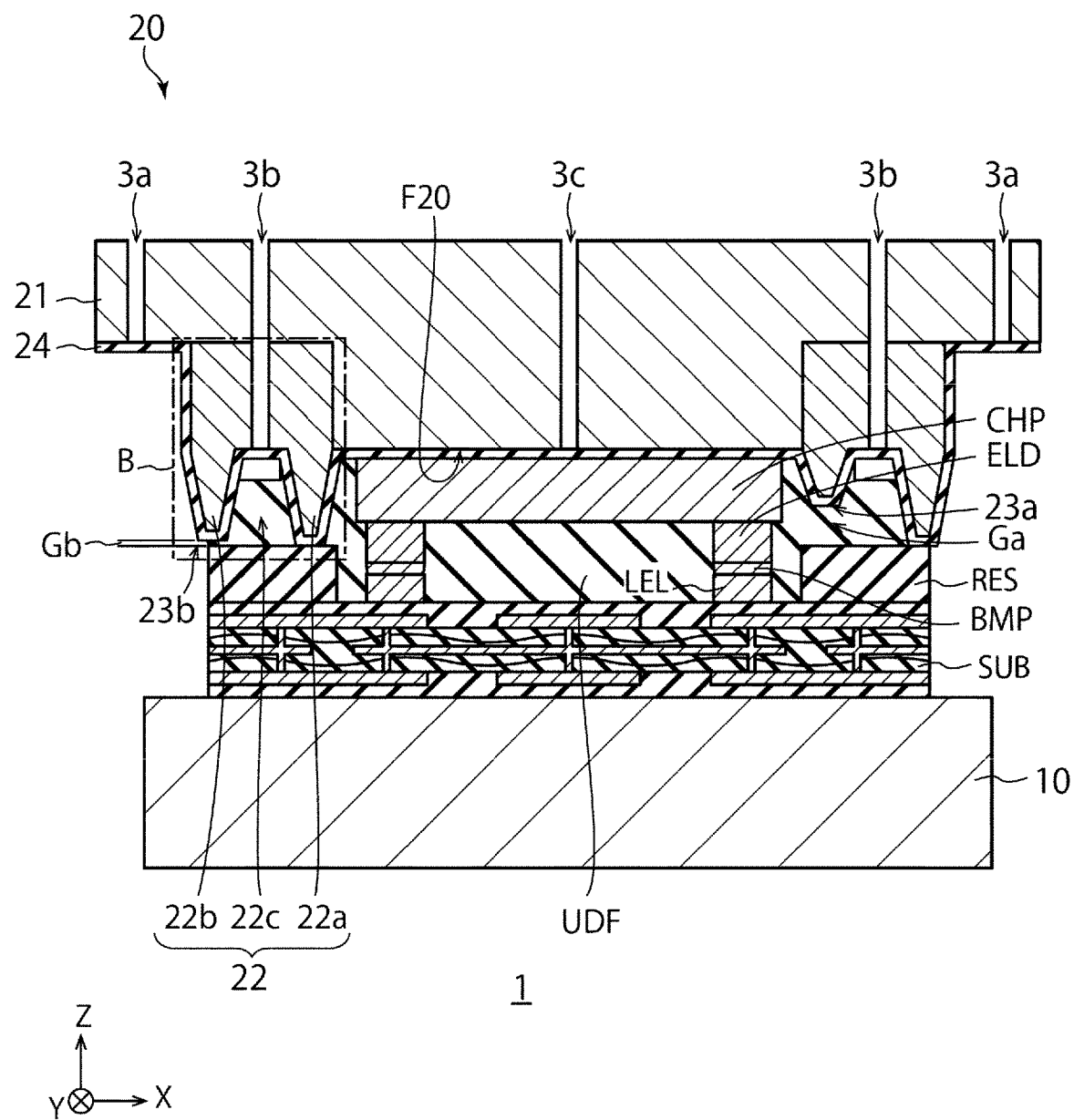
FIG. 3 is a cross-sectional view showing a state in which the bonding tool is pressing a semiconductor chip against an interconnection substrate.
Figure 4:
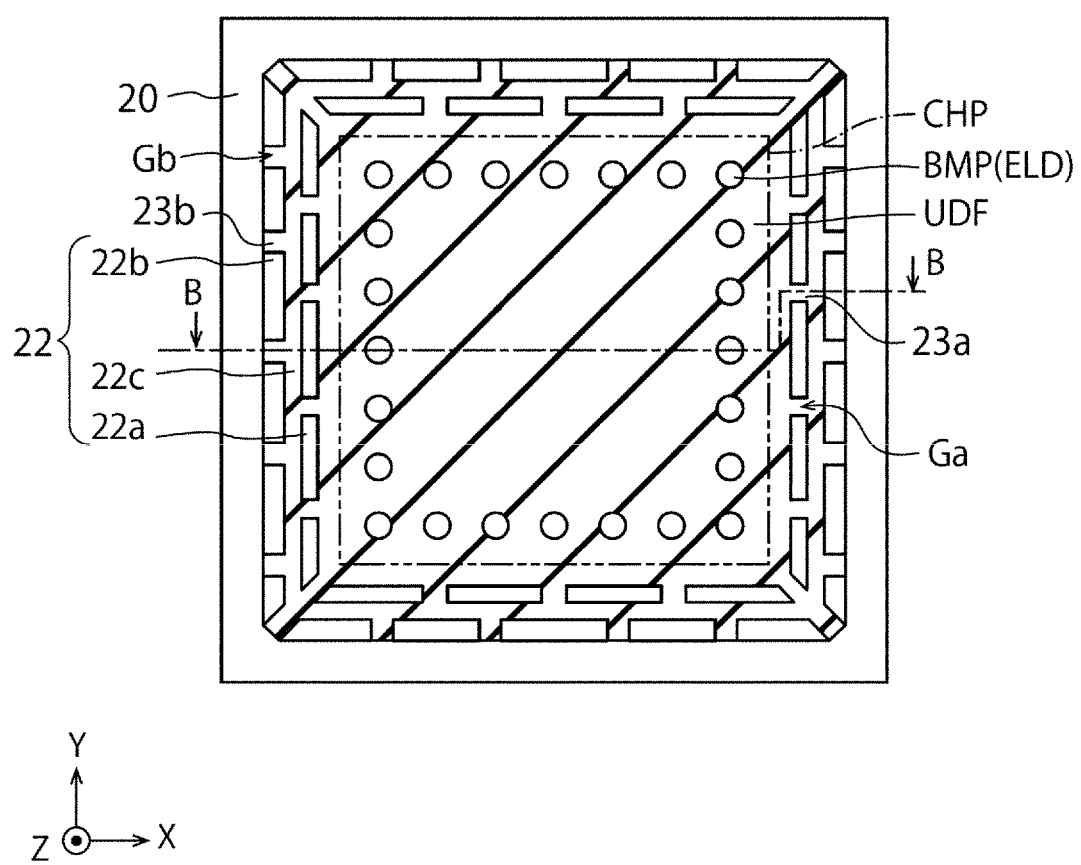
FIG. 4 is a plan view showing the state in which the bonding tool is pressing the semiconductor chip against the interconnection substrate.

FIG. 3 is a cross-sectional view showing a state in which the bonding tool 20 is pressing the semiconductor chip CHP against the interconnection substrate SUB. FIG. 4 is a plan view showing the state in which the bonding tool 20 is pressing the semiconductor chip CHP against the interconnection substrate SUB. FIG. 3 corresponds to a cross-section taken along a line B-B of FIG. 4. In FIG. 4, a position of the semiconductor chip CHP is denoted by a virtual line.

In a state of FIG. 1, the bonding tool 20 moves the semiconductor chip CHP toward the interconnection substrate SUB while heating the semiconductor chip CHP to approximately 100° C. to 200° C. The bonding tool 20 heats the semiconductor chip CHP and pressurizes the semiconductor chip CHP against the interconnection substrate SUB until the bumps BMP come in contact with the lead electrodes LEL and the protruding portion 22 comes in contact with the solder resist RES of the interconnection substrate SUB.

Next, a temperature of the bonding tool 20 is raised to be equal to or higher than a melt temperature of the metal bumps BMP. As a result, the bumps BMP are melted and connect the electrodes ELD to the lead electrodes LEL, the underfill material UDF is deformed, and the semiconductor chip CHP, the electrodes ELD, the lead electrodes LEL, and the bumps BMP are encapsulated with the deformed underfill material UDF. The underfill material UDF fills the space surrounded by the main body portion 21 and the protruding portion 22 of the bonding tool 20 and the interconnection substrate SUB. Furthermore, the surplus underfill material UDF overflows from the gaps Ga between the notch portions 23a of the first protruding portion 22a and the solder resist RES of the interconnection substrate SUB to the outside of the space. The underfill material UDF thereby accumulates in the groove 22c. Each of the gaps Ga has a function as a vent hole (air vent) when the underfill material UDF is filled into the space and a function as a lead-out hole of leading out the underfill material UDF. At this time, the gap Gb between each of the notch portions 23b of the second protruding portion 22b and the solder resist RES of the interconnection substrate SUB functions as a vent hole (air vent) and evacuates the air from the groove 22c so that the underfill material UDF smoothly accumulates in the groove 22c. Air bubbles generated within the underfill material UDF are thereby moved from the notch portions 23a to the groove 22c by a pressure difference between a space closer to the semiconductor chip CHP and the groove 22c, further passed through the notch portions 23b, and removed from the space closer to the semiconductor chip CHP; thus, it is possible to prevent a vapor explosion in the reflow process and formation of a leak path. This contributes to an improvement in reliability of a semiconductor package.

A volume of the underfill material UDF adhesively attached or coated onto the semiconductor chip CHP is larger than a volume of a first space that is a space obtained by excluding, from the space surrounded by the main body portion 21, the protruding portion 22, and the interconnection substrate SUB shown in FIG. 3, volumes of configurations other than the underfill material UDF, e.g., the semiconductor chip CHP, the electrodes ELD, the bumps BMP, and the lead electrodes LEL present in the space. The underfill material UDF can be thereby filled into the first space when the bonding tool 20 presses the semiconductor chip CHP against the interconnection substrate SUB. In addition, it is preferable that the volume of the underfill material UDF is smaller than a volume that is an addition of a volume of a second space surrounded by the groove 22c and the solder resist RES of the interconnection substrate SUB to the volume of the first space. It is thereby possible to prevent leakage of the excess underfill material UDF from the second protruding portion 22b to the outside while the semiconductor chip CHP, the electrodes ELD, the bumps BMP, and the lead electrodes LEL are sufficiently encapsulated with the underfill material UDF. Moreover, this can contribute to saving of the underfill material UDF.

After the electrodes ELD are connected to the lead electrodes LEL via the metal bumps BMP and the underfill material UDF reaches a degree of cure at which the underfill material UDF can be extracted, an operation of pressurization and heating by the bonding tool 20 is released. The bonding tool 20 is forced up and a product is taken out.

It is noted that the first protruding portion 22a may be either formed integrally with the bonding tool 20 as a part of the bonding tool 20 or fixed to the bonding tool 20 by a bolt, an adhesive, or the like as a separate member from the bonding tool 20.

Furthermore, providing the groove 22c enables absorption of unevenness in the volume of the underfill material UDF. Therefore, even with the unevenness in the volume of the underfill material UDF by as much as a volume of a space formed by the groove 22c and the solder resist RES, it is possible to stably encapsulate the semiconductor chip CHP, the electrodes ELD, the bumps BMP, and the lead electrodes LEL with the underfill material UDF.

As shown in FIG. 4, the notch portions 23a and 23b may be provided alternately, i.e., in a staggered fashion by a half pitch in the X direction or the Y direction along the outer edge of the holding surface F20 in a view from the Z direction. The notch portions 23a and 23b are disposed in a staggered fashion in a view from the X direction or the Y direction. In this case, the notch portions 23a are not in communication with the notch portions 23b in the view from the X direction or the Y direction. On the other hand, as described later with reference to FIG. 7, the notch portions 23a and 23b may be disposed at the same pitch along the outer edge of the holding surface F20 and aligned at corresponding positions.

Moreover, by providing the protruding portion 22 in the bonding tool 20, the bonding tool 20 is stopped when the protruding portion 22 comes in contact with the interconnection substrate SUB, and a height of the semiconductor chip CHP relative to the interconnection substrate SUB is determined. That is, the height of the semiconductor chip CHP relative to the interconnection substrate SUB is determined depending on a height of the protruding portion 22. It is thereby possible to make the height of the semiconductor chip CHP relative to the interconnection substrate SUB generally uniform even with unevenness in the volume of the underfill material UDF adhesively attached or coated onto the semiconductor chip CHP. As a result, a thickness of a semiconductor package is made stable, an area of connection between each electrode ELD and each lead electrode LEL is made stable, and the improvement in reliability can be achieved.

Moreover, the air bubbles generated within the underfill material UDF can be removed from the space closer to the semiconductor chip CHP via the notch portions 23b. It is thereby possible to prevent the vapor explosion in the reflow process and the leak path.

Second Embodiment

Figure 5:
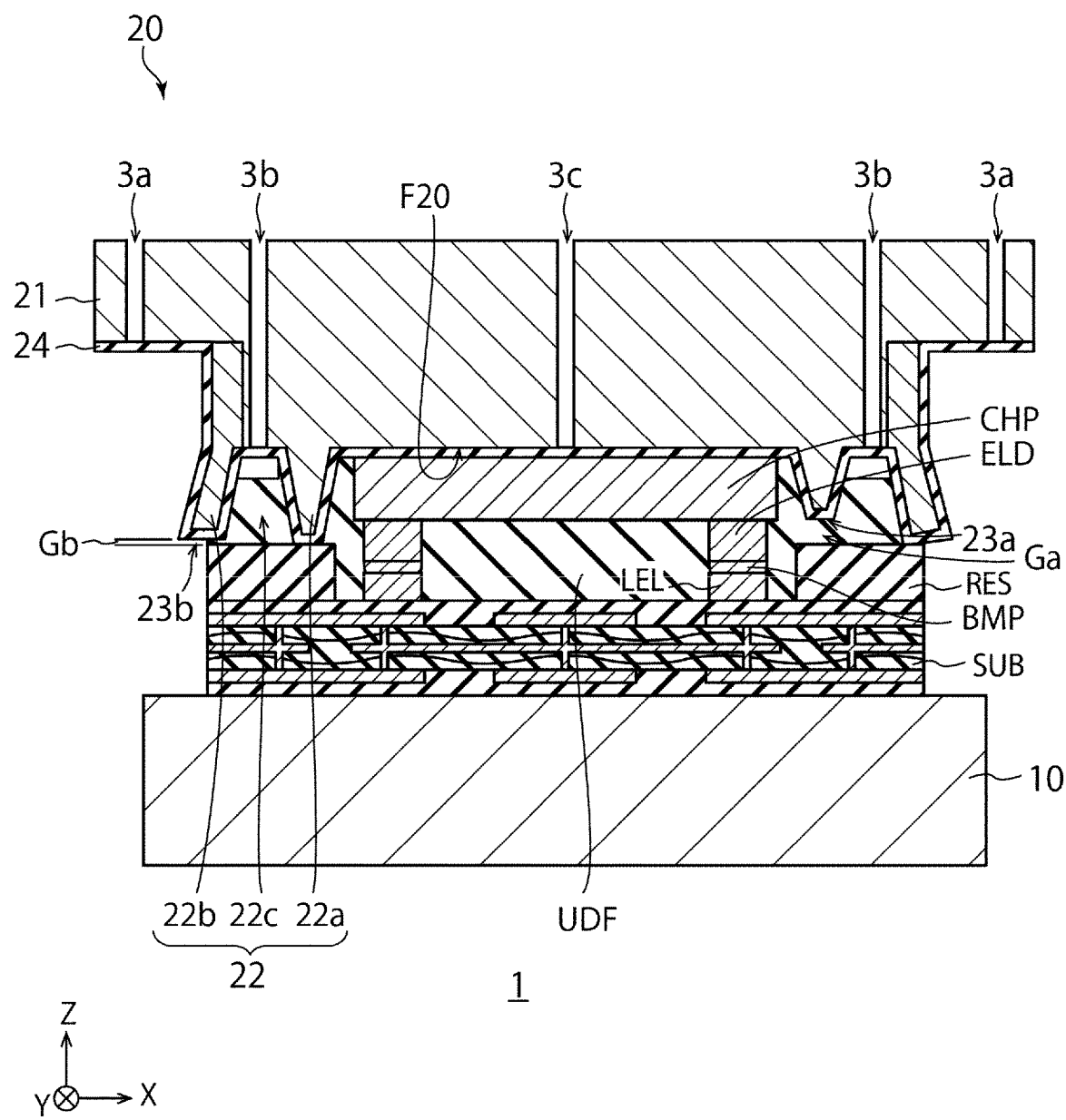
FIG. 5 is a schematic cross-sectional view showing an example of configurations of a bonding apparatus according to a second embodiment.
Figure 6:
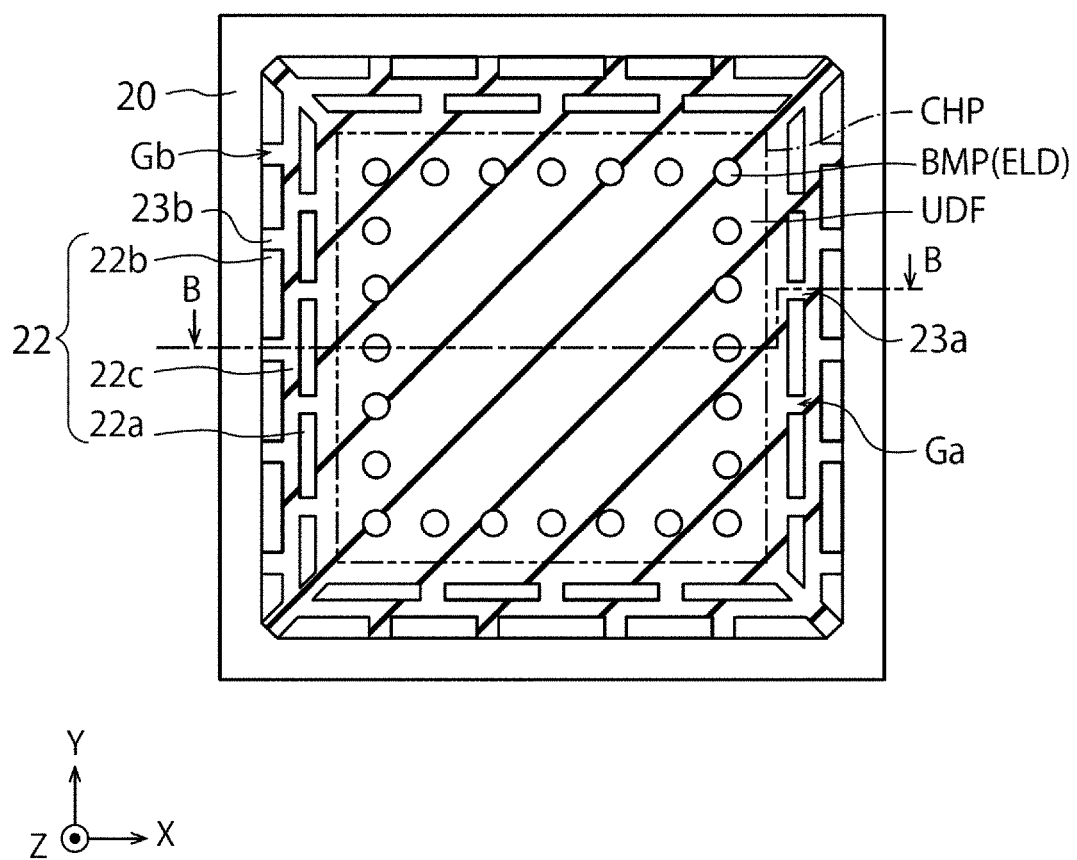
FIG. 6 is a schematic plan view showing an example of configurations of a bonding tool according to the second embodiment.

FIG. 5 is a schematic cross-sectional view showing an example of configurations of the bonding apparatus 1 according to a second embodiment. FIG. 6 is a schematic plan view showing an example of configurations of the bonding tool 20 according to the second embodiment. FIG. 5 corresponds to a cross-section taken along a line B-B of FIG. 6. It is noted that FIGS. 5 and 6 show a state in which the bonding tool 20 is already pressing the semiconductor chip CHP against the interconnection substrate SUB. Furthermore, in FIG. 6, the position of the semiconductor chip CHP is denoted by a virtual line.

In the second embodiment, the second protruding portion 22b is curved in such a manner as to spread outward (in a radiation direction) from a center of the holding surface F20 toward the outer edge thereof as the second protruding portion 22b is closer to the stage 10 from the holding surface F20. That is, as shown in FIG. 5, the second protruding portion 22b is a plate-like member having a shape broadening toward a bottom. Moreover, similarly to the first embodiment, the material lower in elastic modulus than the material for the main body portion 21 is used for the first protruding portion 22a. The first protruding portion 22a is provided as a separate member from the main body portion 21 and can be fixed to the bonding tool 20 by, for example, a bolt or an adhesive.

A material higher in elastic modulus than the material for the first protruding portion 22a is used for the second protruding portion 22b. The second protruding portion 22b is configured as a separate member from the bonding tool 20. The second protruding portion 22b may be, for example, a plate-like member formed from the same material as that for the bonding tool 20, e.g., a metallic material such as stainless steel. The second protruding portion 22b presses the underfill material UDF from a transverse direction at a pressure, for example, equal to or lower than 10% of a pressure at which the bonding tool 20 presses the underfill material UDF. It is thereby possible to apply a pressurizing force of the bonding tool 20 to the underfill material UDF and to further accelerate discharge of the air bubbles.

The bonding tool 20 is stopped when the second protruding portion 22b comes in contact with the interconnection substrate SUB. The second protruding portion 22b is slightly distorted and presses the underfill material UDF from the transverse direction at the pressure described above. Applying the pressures of the bonding tool 20 and the second protruding portion 22b to the underfill material UDF enables discharge of the air bubbles. It is thereby possible to prevent the vapor explosion in the reflow process.

When the second protruding portion 22b comes in contact with the interconnection substrate SUB, the main body portion 21, the second protruding portion 22b, and the interconnection substrate SUB form a space that accommodates therein the semiconductor chip CHP. The first protruding portion 22a is set to have a height to such an extent that the first protruding portion 22a does not come in contact with the interconnection substrate SUB at this time of contact of the second protruding portion 22b with the interconnection substrate SUB. The height of the semiconductor chip CHP relative to the interconnection substrate SUB is determined depending on a position of a tip end portion of the second protruding portion 22b. The first protruding portion 22a has a function to determine a boundary between a semiconductor package and a fillet. It is noted that it is possible to prevent damage of the solder resist RES even when the second protruding portion 22b comes in contact with the solder resist RES since a front surface of the second protruding portion 22b is covered with the film 24.

The other configurations of the bonding apparatus 1 according to the second embodiment may be similar to the corresponding configurations of the bonding apparatus 1 according to the first embodiment. Therefore, according to the second embodiment, it is further possible to obtain similar advantages to those according to the first embodiment.

(Modification)

Figure 7:
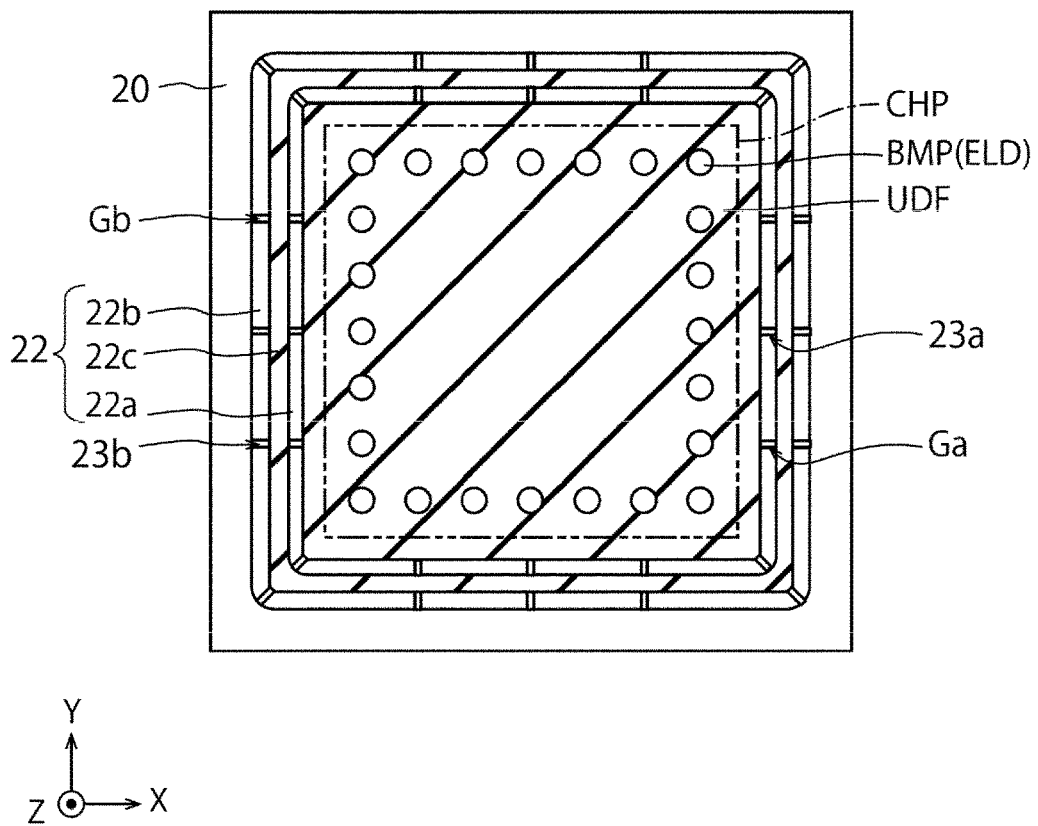
FIG. 7 is a schematic plan view showing an example of configurations of a bonding apparatus according to a modification.

FIG. 7 is a schematic plan view showing an example of configurations of the bonding apparatus 1 according to a modification. As shown in FIGS. 2, 4, and 6, the notch portions 23a and 23b according to the first and second embodiments are provided alternately, i.e., in staggered fashion by a half pitch in the X direction or the Y direction along the outer edge of the holding surface F20. However, as shown in FIG. 7, the notch portions 23a and 23b may be disposed generally at the same pitch in the X direction or the Y direction and aligned at the corresponding positions on sides of the outer edge of the holding surface F20 in the view from the Z direction. In this case, in the view from the X direction or the Y direction, the notch portions 23a and 23b are aligned to one another and in communication with a space that accommodates therein the semiconductor chip CHP from the outside. Even with such configurations, the advantages of the first and second embodiments are not lost.

Figure 8:
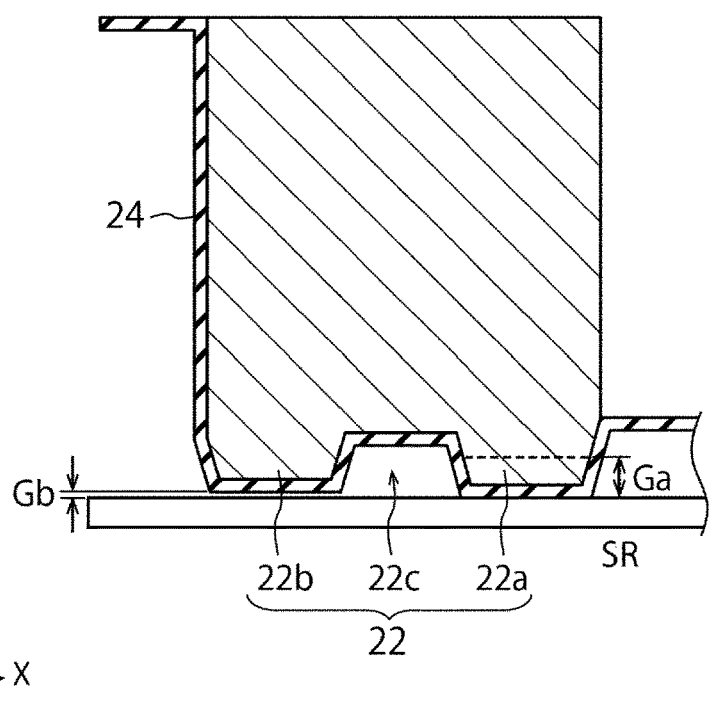
FIG. 8 is a schematic plan view showing an example of configurations in a broken line frame B of FIG. 3.

FIG. 8 is a schematic plan view showing an example of configurations in a broken line frame B of FIG. 3. FIG. 8 shows the configurations at dimensional proportions closer to actual dimensional proportions than dimensional proportions shown FIG. 3 and the like. The first protruding portion 22a and the second protruding portion 22b are formed in a wide fashion to extend in the X direction, i.e., a direction in which the space accommodating therein the semiconductor chip CHP is in communication with the outside of the space, as shown in FIG. 8.

A height of each gap Ga, i.e., a width thereof in the Z direction is larger than a height of each gap Gb. It is noted that the height of the gap Ga is denoted by a broken line in FIG. 8. The gap Ga is thereby capable of simultaneously functioning as the vent hole (air vent) and the lead-out hole of leading out the underfill material UDF. Furthermore, the gap Gb is capable of functioning as the vent hole (air vent) while preventing the leakage of the underfill material UDF to the outside.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor manufacturing apparatus comprising:
   a stage configured to hold a substrate; and
   a tool configured to press the substrate and a semiconductor chip against each other, wherein
   the tool includes:
      a main body having a holding surface configured to hold the semiconductor chip;
      a first protrusion provided along an outer edge of the holding surface and that protrudes from the holding surface toward the stage;
      a second protrusion provided outside of the first protrusion along the outer edge of the holding surface and that protrudes from the holding surface toward the stage; and
      a groove provided between the first protrusion and the second protrusion, and
   wherein the first protrusion has first notches along the outer edge of the holding surface.

2. The semiconductor manufacturing apparatus according to claim 1, wherein
   the tool is configured to press the semiconductor chip against the substrate until at least a portion of the first protrusion or the second protrusion comes in contact with the substrate.

3. The semiconductor manufacturing apparatus according to claim 1, wherein
   (i) the main body, (ii) the first protrusion or the second protrusion, and (iii) the substrate form a space surrounding the semiconductor chip when the first protrusion or the second protrusion comes in contact with the substrate, and
   a resin fills the space.

4. The semiconductor manufacturing apparatus according to claim 3, wherein
   the groove accommodates the resin overflowing from the space when the first protrusion or the second protrusion comes into contact with the substrate.

5. The semiconductor manufacturing apparatus according to claim 1, wherein
   the second protrusion has second notches along the outer edge of the holding surface.

6. A semiconductor manufacturing apparatus comprising:
   a stage configured to hold a substrate; and
   a tool configured to press the substrate and a semiconductor chip against each other, wherein
   the tool includes:
      a main body having a holding surface configured to hold the semiconductor chip;
      a first protrusion provided along an outer edge of the holding surface and that protrudes from the holding surface toward the stage;
      a second protrusion provided outside of the first protrusion along the outer edge of the holding surface and that protrudes from the holding surface toward the stage; and
      a groove provided between the first protrusion and the second protrusion, and
   wherein the first protrusion and the second protrusion include a material having a lower elastic modulus than the main body.

7. The semiconductor manufacturing apparatus according to claim 1, wherein
   the second protrusion is curved from a center of the holding surface toward the outer edge of the holding surface where the second protrusion becomes closer to the stage from the holding surface.

8. The semiconductor manufacturing apparatus according to claim 1, wherein the stage includes one of a vacuum chuck or an electromagnetic chuck.

9. A semiconductor manufacturing apparatus comprising:
   a stage configured to hold a substrate; and
   a tool configured to press the substrate and a semiconductor chip against each other, wherein
   the tool includes:
      a main body having a holding surface configured to hold the semiconductor chip;
      a first protrusion provided along an outer edge of the holding surface and that protrudes from the holding surface toward the stage;
      a second protrusion provided outside of the first protrusion along the outer edge of the holding surface and that protrudes from the holding surface toward the stage; and
      a groove provided between the first protrusion and the second protrusion,
   wherein the substrate includes a plurality of interconnection layers, and
   wherein the substrate includes a plurality of insulating layer separating the plurality of interconnection layers.

10. The semiconductor manufacturing apparatus according to claim 1, wherein the tool includes a covering film covering the holding surface, the main body, the first protrusion, the second protrusion and the groove.

11. The semiconductor manufacturing apparatus according to claim 10, wherein the covering film is an insulating film.

12. The semiconductor manufacturing apparatus according to claim 1, wherein the groove has a width between 100 microns and 300 microns.

13. The semiconductor manufacturing apparatus according to claim 6, wherein the first protrusion and the second protrusion are formed of a resin material, and the main body portion is formed of a metal material.

14. The semiconductor manufacturing apparatus according to claim 1, wherein the second protrusion has second notches in part of the second protrusion along the outer edge of the holding surface.

15. The semiconductor manufacturing apparatus according to claim 14, wherein the first notches are arranged alternately with the second notches.

16. The semiconductor manufacturing apparatus according to claim 14, wherein the first notches and the second notches have a same pitch.

17. The semiconductor manufacturing apparatus according to claim 14, wherein the first notches and the second notches are aligned with each other.

* * * * *